United States Patent
Cui et al.

(10) Patent No.: US 12,198,746 B2
(45) Date of Patent: Jan. 14, 2025

(54) IN-MEMORY COMPUTING UNIT AND IN-MEMORY COMPUTING CIRCUIT HAVING RECONFIGURABLE LOGIC

(71) Applicant: INSTITUTE OF MICROELECTRONICS, CHINESE ACADEMY OF SCIENCES, Beijing (CN)

(72) Inventors: Yan Cui, Beijing (CN); Jun Luo, Beijing (CN); Meiyin Yang, Beijing (CN); Jing Xu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 174 days.

(21) Appl. No.: 17/966,476

(22) Filed: Oct. 14, 2022

(65) Prior Publication Data

US 2023/0178133 A1    Jun. 8, 2023

(30) Foreign Application Priority Data

Dec. 2, 2021  (CN) .......................... 202111471864.8

(51) Int. Cl.
G11C 11/16  (2006.01)
H03K 19/20  (2006.01)

(52) U.S. Cl.
CPC ...... *G11C 11/1697* (2013.01); *G11C 11/1659* (2013.01); *H03K 19/20* (2013.01)

(58) Field of Classification Search
CPC ........................... G11C 11/1697; G11C 11/16
USPC ....................................................... 365/225.5
See application file for complete search history.

(56) References Cited

U.S. PATENT DOCUMENTS

2008/0259681 A1 * 10/2008 Branch ................. G11C 11/412
                                                                          365/181
2016/0276025 A1 *  9/2016 Tatsumura ......... G11C 13/0028

* cited by examiner

*Primary Examiner* — Muna A Techane
(74) *Attorney, Agent, or Firm* — Goodwin Procter LLP

(57) ABSTRACT

An in-memory computing circuit having reconfigurable logic, including: an input stage and N output stages which are cascaded. The input stage includes $2^N$ STT-MTJs. Each output stage includes STT-MTJs, of which a quantity is equal to a half of a quantity of STT-MTJs in a just previous stage. Two STT-MTJs in the previous stage and one STT-MTJ in the subsequent stage form a double-input single-output in-memory computing unit. Each double-input single-output in-memory computing unit can implement the four logical operations, i.e., NAND, NOR, AND, and OR, under different configurations. Data storage and logical operations can be realized under the same circuit architecture, and reconfigurations among different logic can be achieved.

18 Claims, 3 Drawing Sheets

IN-MEMORY COMPUTING UNIT AND IN-MEMORY COMPUTING CIRCUIT HAVING RECONFIGURABLE LOGIC

This application claims priority to Chinese Patent Application No. 202111471864.8, titled "IN-MEMORY COMPUTING UNIT AND IN-MEMORY COMPUTING CIRCUIT HAVING RECONFIGURABLE LOGIC," filed on Dec. 2, 2021 with the China National Intellectual Property Administration, which is incorporated herein by reference in its entirety.

FIELD

The present disclosure relates to the technical field of integrated circuits, and in particular, to an in-memory computing unit and an in-memory computing circuit having reconfigurable logic.

BACKGROUND

Development of artificial intelligence has prompted image recognition to be one of necessary capabilities of intelligent systems. The image recognition is generally implemented as two parts, i.e., feature extraction and classification. Image edge extraction is one of the most common manners in the feature extraction.

Conventional operators for the image edge extraction include the Robert operator, the Sobel operator, the Prewitt operator, the Kirsch operator, the Robinson operator, the Canny operator, and the like. Specific circuits for implementing these operators are limited by device characteristics and circuit architecture, in which a memory is separate from a processor. Therefore, the circuits are subject to problems such as the "memory wall" and the "power limit throttling", and are limited to a specific function.

SUMMARY

In order to address the above issue, an in-memory computing unit and an in-memory computing circuit having reconfigurable logic are provided according embodiments of the present disclosure. Data storage and logical operations can be implemented under same circuit architecture, and reconfiguration among different logic can be achieved.

According to a first aspect, a double-input single-output (DISO) in-memory computing unit is provided, including two input STT-MTJs and one output STT-MTJ, where: free layer sides of the two input STT-MTJs serves as a voltage input terminal and are connected to a positive terminal of an operating voltage, reference layer sides of the two input STT-MTJs are connected to a reference layer side of the output STT-MTJ, and a free layer side of the output STT-MTJ serves as a ground and is connected to a negative terminal of the operating voltage; or, reference layer sides of the two input STT-MTJs serve as a voltage input terminal and are connected to a positive terminal of an operating voltage, free layer sides of the two input STT-MTJs are connected to a free layer side of the output STT-MTJ, and a reference layer side of the output STT-MTJ serves as a ground and is connected to a negative terminal of the operating voltage.

In an embodiment, the DISO in-memory computing unit is configured to implement one of four logic operations: NAND, NOR, AND, and OR, where: the DISO in-memory computing unit is configured to implement the NAND logical operation, in response to the output STT-MTJ being initialized to logic 0, the operating voltage at the voltage input terminal with respect to the ground ranging from 0.0731V to 0.0908V, and a ratio among critical dimensions of the two input STT-MTJs and the output STT-MTJ being 1:1:1; the DISO in-memory computing unit is configured to implement the NOR logical operation, in response to the output STT-MTJ being initialized to logic 0, the operating voltage at the voltage input terminal with respect to the ground ranging from 0.0650V to 0.0730V, and a ratio among critical dimensions of the two input STT-MTJs and the output STT-MTJ being 1:1:1; the DISO in-memory computing unit is configured to implement the AND logical operation, in response to the output STT-MTJ being initialized to logic 1, the operating voltage at the voltage input terminal with respect to the ground ranging from −0.0650-0.202V to 0.195V, and a ratio among critical dimensions of the two input STT-MTJs and the output STT-MTJ being 1:1:0.5; and the DISO in-memory computing unit is configured to implement the OR logical operation, in response to the output STT-MTJ being initialized to logic 1, the operating voltage at the voltage input terminal with respect to the ground ranging from −0.211V to 0.205V, and a ratio among critical dimensions of the two input STT-MTJs and the output STT-MTJ being 1:1:0.7.

According to a second aspect, an in-memory computing circuit having reconfigurable logic is provided, including: an input stage, where the input stage includes STT-MTJs of which a quantity is $2^N$, and each of the STT-MTJs stores one bit; N output stages, where a first output stage of the N output stages includes STT-MTJs of which a quantity is $2^{N-1}$, and for each stage other than the first output stage in the N output stages, a quantity of STT-MTJs in said stage is equal to a half of a quantity of STT-MTJs in an output stage, which is of the N output stages and just previous to said stage, and a last output stage of the N output stages includes a single STT-MTJ; and multiple switches, disposed between the input stage and the first output stage and between successive ones of the N output stages, where the multiple switches are configured to connect and disconnect the STT-MTJs between the input stage and the first output stage, and connect and disconnect the STT-MTJs among the successive ones of the N output stages.

The STT-MTJs in the first output stage are in one-to-one correspondence to STT-MTJ groups, each of which includes two STT-MTJs of the STT-MTJs in the input stage, and the STT-MTJs in the first output stage and the STT-MTJs in the input stage form double-input single-output (DISO) in-memory computing units, of which a quantity is $2^{N-1}$, via a configuration of the switches between the input stage and the first output stage. In each of the DISO in-memory computing units, the two STT-MTJs in the input stage serve as two input STT-MTJs, and the corresponding STT-MTJ in the first output stage serves as an output STT-MTJ. Free layer sides of the two input STT-MTJs serve as a voltage input terminal and are connected to a positive terminal of an operating voltage, reference layer sides of the two input STT-MTJs are connected to a reference layer side of the output STT-MTJ, and a free layer side of the output STT-MTJ serves as a ground and is connected to a negative terminal of the operating voltage. Or, reference layer sides of the two input STT-MTJs serve as a voltage input terminal and are connected to a positive terminal of an operating voltage, free layer sides of the two input STT-MTJs are connected to a free layer side of the output STT-MTJ, and a reference layer side of the output STT-MTJ serves as a ground and is connected to a negative terminal of the operating voltage.

For each output stage of the N output stages, the STT-MTJs in said output stage are in one-to-one correspondence to STT-MTJ groups, each of which includes two STT-MTJs of the STT-MTJs in the output stage which is of the N output stages and just previous to said stage, and the STT-MTJs in said stage and the STT-MTJs in the output stage form one or more DISO in-memory computing units via a configuration of the switches between said stage and the output stage. In each of the one or more DISO in-memory computing units, the two STT-MTJs in the output stage serve as two input STT-MTJs, and the corresponding STT-MTJ in said output stage serves as an output STT-MTJ. Free layer sides of the two input STT-MTJs serve as a voltage input terminal and are connected to a positive terminal of an operating voltage, reference layer sides of the two input STT-MTJs are connected to a reference layer side of the output STT-MTJ, and a free layer side of the output STT-MTJ serves as a ground and is connected to a negative terminal of the operating voltage. Or, reference layer sides of the two input STT-MTJs serve as a voltage input terminal and are connected to a positive terminal of an operating voltage, free layer sides of the two input STT-MTJs are connected to a free layer side of the output STT-MTJ, and a reference layer side of the output STT-MTJ serves as a ground and is connected to a negative terminal of the operating voltage.

In an embodiment, each of the DISO in-memory computing units and the one or more DISO in-memory computing units is configured to implement one of four logical operations: NAND, NOR, AND, and OR, where: the DISO in-memory computing unit is configured to implement the NAND logical operation, in response to the output STT-MTJ being initialized to logic 0, the operating voltage at the voltage input terminal with respect to the ground ranging from 0.0731V to 0.0908V, and a ratio among critical dimensions of the two input STT-MTJs and the output STT-MTJ being 1:1:1; the DISO in-memory computing unit is configured to implement the NOR logical operation, in response to the output STT-MTJ being initialized to logic 0, the operating voltage at the voltage input terminal with respect to the ground ranging from 0.0650V to 0.0730V, and a ratio among critical dimensions of the two input STT-MTJs and the output STT-MTJ being 1:1:1; the DISO in-memory computing unit is configured to implement the AND logical operation, in response to the output STT-MTJ being initialized to logic 1, the operating voltage at the voltage input terminal with respect to the ground ranging from −0.202V to 0.195V, and a ratio among critical dimensions of the two input STT-MTJs and the output STT-MTJ being 1:1:0.5; and the DISO in-memory computing unit is configured to implement the OR logical operation, in response to the output STT-MTJ being initialized to logic 1, the operating voltage at the voltage input terminal with respect to the ground ranging from −0.211V to 0.205V, and a ratio among critical dimensions of the two input STT-MTJs and the output STT-MTJ being 1:1:0.7.

In an embodiment, the in-memory computing circuit is reconfigurable among $4^n$ configurations, where n represents a quantity of the DISO in-memory computing units plus the one or more DISO in-memory computing units in the in-memory computing circuit.

In an embodiment, each of the switches is a single-pole single-throw electronic switch or a single-pole double-throw electronic switch.

In an embodiment, the input stage includes eight STT-MTJs which are a first STT-MTJ, a second STT-MTJ, a third STT-MTJ, a fourth STT-MTJ, a fifth STT-MTJ, a sixth STT-MTJ, a seventh STT-MTJ, and an eighth STT-MTJ, and each of the eight STT-MTJs stores one bit; the first output stage includes four STT-MTJs which are a ninth STT-MTJ, a tenth STT-MTJ, an eleventh STT-MTJ, and a twelfth STT-MTJ; a second output stage of the N output stages includes two STT-MTJs which are a thirteenth STT-MTJ and a fourteenth STT-MTJ; and a third output stage of the N output stages includes the single STT-MTJ which is a fifteenth STT-MTJ. The switches include sixteen switches which are a first switch to a sixteenth switch.

The STT-MTJs in the first output stage are in one-to-one correspondence to STT-MTJ groups, each of which includes two STT-MTJs of the STT-MTJs in the input stage, and the STT-MTJs in the input stage and the STT-MTJs in the first output stage form four DISO in-memory computing units.

The first STT-MTJ, the fourth STT-MTJ, and the ninth STT-MTJ form a first in-memory computing unit of the four DISO in-memory computing units, where a free layer side of the first STT-MTJ and a free layer side of the fourth STT-MTJ serve as the voltage input terminal and are connected to a first operating voltage, a reference layer side of the first STT-MTJ and a reference layer side of the fourth STT-MTJ are connected to a reference layer side of the ninth STT-MTJ via the first switch, and a free layer side of the ninth STT-MTJ is connected to a ground via the ninth switch.

The second STT-MTJ, the third STT-MTJ, and the tenth STT-MTJ form a second in-memory computing unit of the four DISO in-memory computing units, where a free layer side of the second STT-MTJ and a free layer side of the third STT-MTJ serve as the voltage input terminal and are connected to the first operating voltage, a reference layer side of the second STT-MTJ and a reference layer side of the third STT-MTJ are connected to a reference layer side of the tenth STT-MTJ via the fourth switch, and a free layer side of the tenth STT-MTJ is connected to the ground via the twelfth switch.

The fifth STT-MTJ, the eighth STT-MTJ, and the eleventh STT-MTJ form a third in-memory computing unit of the four DISO in-memory computing units, where a free layer side of the fifth STT-MTJ and a free layer side of the eighth STT-MTJ serve as the voltage input terminal and are connected to the first operating voltage, a reference layer side of the fifth STT-MTJ and a reference layer side of the eighth STT-MTJ are connected to a reference layer side of the eleventh STT-MTJ via the fifth switch, and a free layer side of the eleventh STT-MTJ is connected to the ground via the thirteenth switch.

The sixth STT-MTJ, the seventh STT-MTJ, and the twelfth STT-MTJ form a fourth in-memory computing unit of the four DISO in-memory computing units, where a free layer side of the sixth STT-MTJ and a free layer side of the seventh STT-MTJ serve as the voltage input terminal and are connected to the first operating voltage, a reference layer side of the sixth STT-MTJ and a reference layer side of the seventh STT-MTJ are connected to a reference layer side of the twelfth STT-MTJ via the eighth switch, and a free layer side of the twelfth STT-MTJ is connected to the ground via the sixteenth switch.

The STT-MTJs in the second output stage are in one-to-one correspondence to STT-MTJ groups, each of which includes two STT-MTJs of the STT-MTJs in the first output stage, and the STT-MTJs in the first output stage and the STT-MTJs in the second output stage form two DISO in-memory computing units.

The ninth STT-MTJ, the tenth STT-MTJ, and the thirteenth STT-MTJ form a fifth in-memory computing unit of the two DISO in-memory computing units, where a reference layer side of the ninth STT-MTJ and a reference layer side of the tenth STT-MTJ serve as the voltage input terminal, the reference layer side of the ninth STT-MTJ is connected to a second operating voltage via the second switch, and the reference layer side of the tenth STT-MTJ is connected to the second operating voltage via the third switch, a free layer side of the ninth STT-MTJ is connected to a free layer side of the thirteenth STT-MTJ via the tenth switch, and a free layer side of the tenth STT-MTJ is connected to the free layer side of the thirteenth STT-MTJ via the eleventh switch.

The eleventh STT-MTJ, the twelfth STT-MTJ, and the fourteenth STT-MTJ form a sixth in-memory computing unit of the two DISO in-memory computing units, where a reference layer side of the eleventh STT-MTJ and a reference layer side of the twelfth STT-MTJ serve as the voltage input terminal, the reference layer side of the eleventh STT-MTJ is connected to the second operating voltage via the sixth switch, and the reference layer side of the twelfth STT-MTJ is connected to the second operating voltage via the seventh switch, a free layer side of the eleventh STT-MTJ is connected to a free layer side of the fourteenth STT-MTJ via the fourteenth switch, and a free layer side of the twelfth STT-MTJ is connected to the free layer side of the fourteenth STT-MTJ via the fifteenth switch.

The two STT-MTJs in the second output stage and the single STT-MTJ in the third output stage form a seventh DISO in-memory computing unit.

A free layer side of the thirteenth STT-MTJ and a free layer side of the fourteenth STT-MTJ serve as the voltage input terminal, a reference layer side of the thirteenth STT-MTJ and a reference layer side of the fourteenth STT-MTJ are connected to a reference layer side of the fifteenth STT-MTJ, and a free layer side of the fifteenth STT-MTJ is connected to the ground.

In an embodiment, the in-memory computing circuit having the reconfigurable logic is configured to implement a first-order Robert operator in response to: the first STT-MTJ storing data A, the second STT-MTJ storing a negation of the data A, the third STT-MTJ storing data D, the fourth STT-MTJ storing a negation of the data D, the fifth STT-MTJ storing data C, and the sixth STT-MTJ storing a negation of the data C, the seventh STT-MTJ storing data B, the eighth STT-MTJ storing a negation of the data B, the first in-memory computing unit, the second in-memory computing unit, the third in-memory computing unit, and the fourth in-memory computing unit being configured to implement the AND logical operation, and the fifth in-memory computing unit, the sixth in-memory computing unit, and the seventh in-memory computing unit being configured to implement the OR logical operation.

In an embodiment, the in-memory computing circuit having the reconfigurable logic is configured to implement a gradient operator in response to: the first STT-MTJ storing a negation of data C, the second STT-MTJ storing data A, the third STT-MTJ storing a negation of data B, the fourth STT-MTJ storing the data A, the fifth STT-MTJ storing the data B, the sixth STT-MTJ storing a negation of the data A, the seventh STT-MTJ storing the data C, the eighth STT-MTJ storing the negation of the data A, the first in-memory computing unit, the second in-memory computing unit, the third in-memory computing unit, the fourth in-memory computing unit, the fifth in-memory computing unit, and the sixth in-memory computing unit being configured to implement the NOR logical operation, and the seventh in-memory computing unit being configured to implement the NAND logical operation.

The in-memory computing circuit having the reconfigurable logic is configured to implement a basic operator in response to: the first STT-MTJ storing a negation of data D, the second STT-MTJ storing data C, the third STT-MTJ storing a negation of the data C, the fourth STT-MTJ storing data B, the fifth STT-MTJ storing a negation of the data B, the sixth STT-MTJ storing data A, the seventh STT-MTJ storing the data D, the eighth STT-MTJ storing a negation of the data A, the first in-memory computing unit, the second in-memory computing unit, the third in-memory computing unit, the fourth in-memory computing unit, the fifth in-memory computing unit, and the sixth in-memory computing unit being configured to implement the NOR logical operation, and the seventh in-memory computing unit being configured to implement the NAND logical operation.

The structure of the in-memory computing circuit is provided according to embodiments of the present disclosure. Each logical operation unit includes a DISO in-memory computing unit. Input data, logical operations, and results of the operations are all stored in the same circuit architecture, and hence additional accesses to a memory are not necessary. Moreover, the circuit architecture stores the original input data, the computing operation of image edge extraction, and the output result data, which achieves in-memory computing.

DETAILED DESCRIPTION

Figure 1:
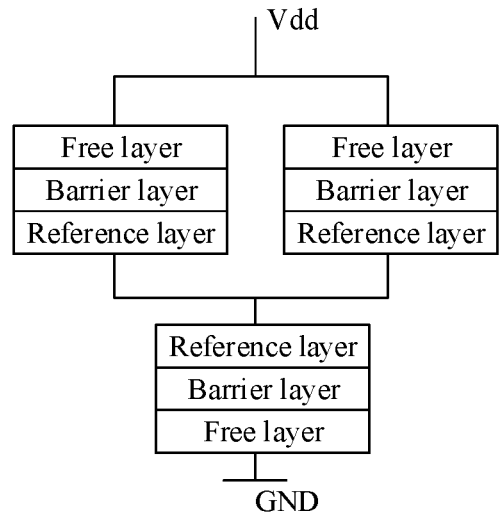
FIG. 1 is a schematic diagram of a double-input single-output in-memory computing unit according to an embodiment of the present disclosure.

In order to clarify objectives, technical solutions, and advantages of embodiments of the present disclosure, hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort shall fall within the protection scope of the present disclosure.

In the specification, claims, and accompanying drawings of the present disclosure, the terms "first", "second", and the like are intended for distinguishing similar objects rather than necessitating a specific order. The data termed in such a way are interchangeable in proper circumstances, so that the embodiments of the present disclosure described herein can be implemented in an order other than the order illustrated or described herein. Moreover, the terms "include", "contain" and any other variants are meant to be non-exclusive. For example, a process, a method, a system, a product, or a device that includes a series of steps or units is not necessarily limited to those expressly listed steps or units, but may include another step or another unit which is not expressly listed or which is inherent to such process, such method, such system, such product, or such device.

Herein the terms "upper", "lower", "left", "right", "front", "rear", "top", "bottom", "inner", "outer", "middle", "vertical", "horizontal", "transverse", "longitudinal", and the like, indicates orientations or position relationships based on illustrations as shown in the drawings. The terms are merely for convenience of describing embodiments of the present disclosure, and are not intended for limiting the indicated devices, elements or components to be arranged, constructed, or operated based on particular orientations.

Moreover, some of the above terms may be further used under other meanings. For example, the term "on top of" may indicate attachment or connection in some cases. Those of ordinary skill in the art can understand specific meanings of such terms in the present disclosure based on specific situations.

Furthermore, the terms "install", "dispose", "provide", "connect", "couple", "socket" should be broadly interpreted. For example, there may be a fixed connection, a detachable connection, or an integral structure, there may be a mechanical connection or an electrical connection, there may be a direct connection or an indirect connection via an intermediate, or there may be connection between inner spaces of two devices, elements, or components. Those of ordinary skill in the art can understand specific meanings of such terms in the present disclosure based on specific situations.

Hereinafter some embodiments of the present disclosure are described in detail in conjunction with the drawings. Embodiments described hereinafter and features therein are may be combined where there is no conflict.

A double-input single-output (DISO) in-memory computing unit is provided according to an embodiment of the present disclosure. The DISO in-memory computing unit is implemented based on STT-MTJs (spin transfer torque magnetic tunnel junctions). FIG. 1 shows a schematic structural diagram of the in-memory computing unit. As shown in FIG. 1, the DISO in-memory computing unit includes two input STT-MTJs and one output STT-MTJ. Free layer sides (i.e., a terminal at a side where a free layer is located) of the two input STT-MTJs serve as a voltage input terminal and are connected to a positive terminal of an operating voltage Vdd. Reference layer sides (i.e., a terminal at a side where a reference layer is located) of the two input STT-MTJs are connected to a reference layer side of the output STT-MTJ. A free layer side of the output STT-MTJ serves as a ground and is connected to a negative terminal GND of the operating voltage.

Here the DISO in-memory computing unit is formed through serial and parallel connection among STT-MTJs, and states of resistance of the STT-MTJs are used as inputs and an output of logical operations. Reference is made to FIG. 1. Under a certain operating voltage Vdd, different resistance states of the two input STT-MTJs would lead to different combined currents flowing through the output STT-MTJ. Therefore, the resistance state of the output STT-MTJ is correlated with the resistance states of the input STT-MTJs, which can implement the Boolean logic. In addition, different logic may be achieved through initializing the output STT-MTJ to certain resistance state and providing a suitable operating voltage Vdd. Thereby, data storage and logical operations can be realized under the same circuit architecture, and the logic is reconfigurable.

Figure 2:
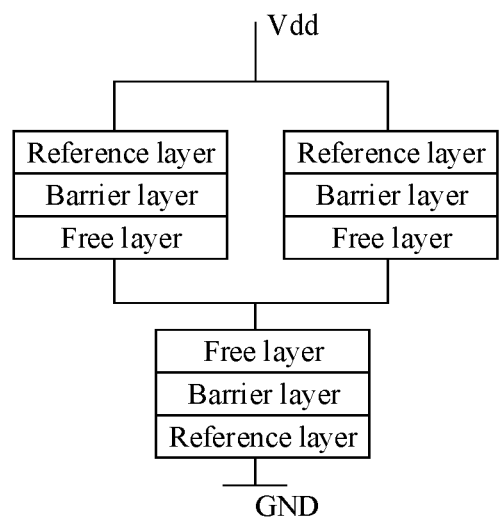
FIG. 2 is a schematic diagram of a double-input single-output in-memory computing unit according to another embodiment of the present disclosure.

FIG. 2 shows a schematic structural diagram of an in-memory computing unit according to another embodiment of the present disclosure. As shown in FIG. 2, the DISO in-memory computing unit includes two input STT-MTJs and one output STT-MTJ. Reference layer sides of the two input STT-MTJs serve as a voltage input terminal and are connected to a positive terminal of an operating voltage Vdd. Free layer sides of the two input STT-MTJs are connected to a free layer side of the output STT-MTJ. The reference layer side of the output STT-MTJ serves as a ground and is connected to a negative terminal GND of the operating voltage. The structure of the in-memory computing unit as shown in FIG. 2 and the structure of the in-memory computing unit as shown in FIG. 1 differ in a manner of connection, and operate based on a same principle that the logic is implemented based on a current flowing through the STT-MTJs.

Practical experiment has evidence that the foregoing DISO in-memory computing units are capable to implement each of following four logical operations: NAND, NOR, AND, and OR.

The DISO in-memory computing unit is configured to implement the NAND logical operation in case of a following condition. The output STT-MTJ is initialized to logic 0, the operating voltage at the voltage input terminal with respect to the ground ranges from 0.0731V to 0.0908V, and a ratio among critical dimensions of the two input STT-MTJs and the output STT-MTJ is 1:1:1.

The DISO in-memory computing unit is configured to implement the NOR logical operation in case of a following condition. The output STT-MTJ is initialized to logic 0, the operating voltage at the voltage input terminal with respect to the ground ranges from 0.0650V to 0.0730V, and a ratio among critical dimensions of the two input STT-MTJs and the output STT-MTJ is 1:1:1.

The DISO in-memory computing unit is configured to implement the AND logical operation in case of a following condition. The output STT-MTJ is initialized to logic 1, the operating voltage at the voltage input terminal with respect to the ground ranges from −0.202V to 0.195V, and a ratio among critical dimensions of the two input STT-MTJs and the output STT-MTJ is 1:1:0.5.

The DISO in-memory computing unit is configured to implement the OR logical operation in case of a following condition. The output STT-MTJ is initialized to logic 1, the operating voltage at the voltage input terminal with respect to the ground ranges from −0.211V to 0.205V, and a ratio among critical dimensions of the two input STT-MTJs and the output STT-MTJ is 1:1:0.7.

It can be seen that the four logical operations can be implemented by the DISO in-memory computing unit through adjusting the operating voltage applied between the voltage input terminal and the ground and adjusting the initialization value of the output STT-MTJ.

On a basis of the DISO in-memory computing unit, an in-memory computing circuit having reconfigurable logic is further provided according to another embodiment of the present disclosure. The in-memory computing unit includes an input stage, N output stages, and multiple switches.

The input stage includes STT-MTJs, of which a quantity of $2^N$ and each of which stores one bit.

Among the N output stages, the first output stage includes $2^{N-1}$ STT-MTJs, and each stage other than the first output stage in the N output stages includes STT-MTJs of which a quantity is equal to a half of a quantity of STT-MTJs in the output stage just previous to said stage. The last output stage includes only one STT-MTJ.

The switches are disposed between the input stage and the first output stage, and between successive output stages. The switches are configured to connect and disconnect the STT-MTJs between the input stage and the first output stage, and connect and disconnect the STT-MTJs among the successive N output stages.

The STT-MTJs in the first output stage are in one-to-one correspondence to STT-MTJ groups, each of which includes two STT-MTJs of the STT-MTJs in the input stage, and the STT-MTJs in the first output stage and the STT-MTJs in the input stage form DISO in-memory computing units, of which a quantity is $2^{N-1}$, via a configuration of the switches between the input stage and the first output stage. In each DISO in-memory computing unit, the two STT-MTJs in the input stage serve as two input STT-MTJs, and the corresponding STT-MTJ in the first output stage serves as an output STT-MTJ. Free layer sides of the two input STT-MTJs serve as a voltage input terminal and are connected to a positive terminal of an operating voltage, reference layer sides of the two input STT-MTJs are connected to a reference layer side of the output STT-MTJ, and a free layer side of the output STT-MTJ serves as a ground and is connected to a negative terminal of the operating voltage. Or, reference layer sides of the two input STT-MTJs serve as a voltage input terminal and are connected to a positive terminal of an operating voltage, free layer sides of the two input STT-MTJs are connected to a free layer side of the output STT-MTJ, and a reference layer side of the output STT-MTJ serves as a ground and is connected to a negative terminal of the operating voltage.

For each output stage, the STT-MTJs in said output stage are in one-to-one correspondence to STT-MTJ groups, each of which includes two STT-MTJs in the output stage just previous to said stage, and the STT-MTJs in said stage and the STT-MTJs in the previous output stage form DISO in-memory computing units via a configuration of the switches between said stage and the previous output stage. In each DISO in-memory computing unit, the two STT-MTJs in the output stage serve as two input STT-MTJs, and the corresponding STT-MTJ in said output stage serves as an output STT-MTJ. Free layer sides of the two input STT-MTJs serve as a voltage input terminal and are connected to a positive terminal of an operating voltage, reference layer sides of the two input STT-MTJs are connected to a reference layer side of the output STT-MTJ, and a free layer side of the output STT-MTJ serves as a ground and is connected to a negative terminal of the operating voltage. Or, reference layer sides of the two input STT-MTJs serve as a voltage input terminal and are connected to a positive terminal of an operating voltage, free layer sides of the two input STT-MTJs are connected to a free layer side of the output STT-MTJ, and a reference layer side of the output STT-MTJ serves as a ground and is connected to a negative terminal of the operating voltage.

Similarly, each DISO in-memory computing unit in the foregoing in-memory computing circuit having reconfigurable logic is capable to implement following four logical operations: NAND, NOR, AND, and OR.

The DISO in-memory computing unit is configured to implement the NAND logical operation in case of a following condition. The output STT-MTJ is initialized to logic 0, the operating voltage at the voltage input terminal with respect to the ground ranges from 0.0731V to 0.0908V, and a ratio among critical dimensions of the two input STT-MTJs and the output STT-MTJ is 1:1:1.

The DISO in-memory computing unit is configured to implement the NOR logical operation in case of a following condition. The output STT-MTJ is initialized to logic 0, the operating voltage at the voltage input terminal with respect to the ground ranges from 0.0650V to 0.0730V, and a ratio among critical dimensions of the two input STT-MTJs and the output STT-MTJ is 1:1:1.

The DISO in-memory computing unit is configured to implement the AND logical operation in case of a following condition. The output STT-MTJ is initialized to logic 1, the operating voltage at the voltage input terminal with respect to the ground ranges from −0.202V to 0.195V, and a ratio among critical dimensions of the two input STT-MTJs and the output STT-MTJ is 1:1:0.5.

The DISO in-memory computing unit is configured to implement the OR logical operation in case of a following condition. The output STT-MTJ is initialized to logic 1, the operating voltage at the voltage input terminal with respect to the ground ranges from −0.211V to 0.205V, and a ratio among critical dimensions of the two input STT-MTJs and the output STT-MTJ is 1:1:0.7.

In essence, herein the in-memory computing circuit having reconfigurable logic includes multiple cascaded stages of the in-memory computing units, and switches are provided between successive two stages to configure connection between the stages. An output of the previous stage serves as an input of the subsequent stage. All logic values are represented by resistance states of the MTJs, and therefore there is no need to exchange data with outside. In addition, each in-memory computing unit can be reconfigured among four Boolean logic operations through different switch settings. Therefore the whole circuit is reconfigurable among with $4^n$ configurations, where n represents a quantity of the DISO in-memory computing units in the circuit.

When constructing the in-memory computing circuit, the switches for the in-memory computing units may be of various forms. For example, each switch may be a single-pole single-throw electronic switch or a single-pole double-throw electronic switch.

Hereinafter an example is illustrated to facilitate understanding the foregoing in-memory computing circuit having reconfigurable logic.

Figure 3:
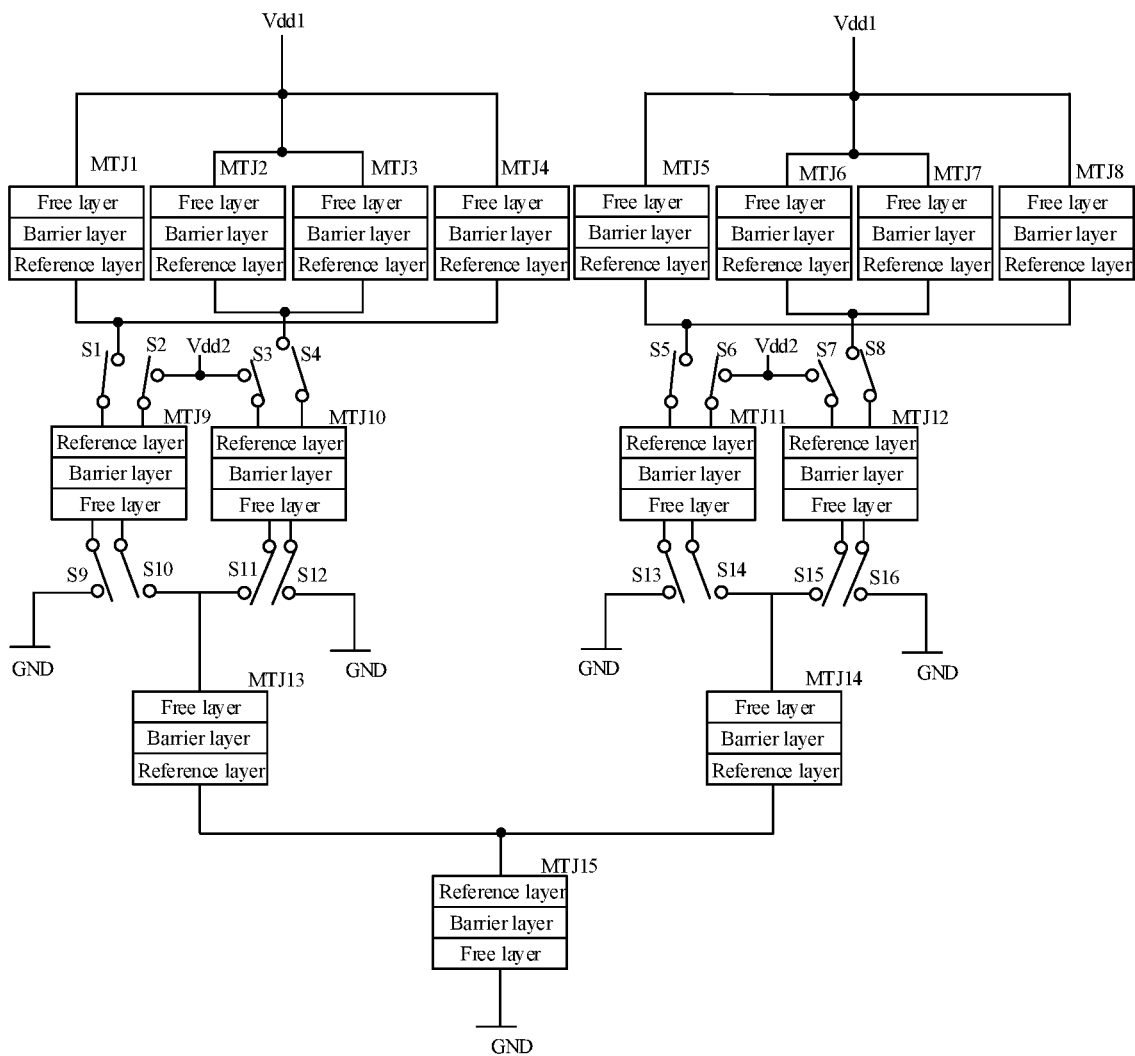
FIG. 3 is a schematic diagram of an in-memory computing circuit having reconfigurable logic according to an embodiment of the present disclosure.

FIG. 3 is a schematic diagram of an in-memory computing circuit having reconfigurable logic according to an embodiment of the present disclosure. As shown in FIG. 3, the in-memory computing circuit includes an input stage, a first output stage, a second output stage, a third output stage, and switches.

The input stage includes eight STT-MTJs, which are a first STT-MTJ, a second STT-MTJ, a third STT-MTJ, a fourth STT-MTJ, a fifth STT-MTJ, a sixth STT-MTJ, a seventh STT-MTJ, and an eighth STT-MTJ, and which are denoted by MTJ1, MTJ2, . . . and MTJ8, respectively. Each of the eight STT-MTJs stores one bit.

The first output stage includes four STT-MTJs, which are a ninth STT-MTJ, a tenth STT-MTJ, an eleventh STT-MTJ, and a twelfth STT-MTJ, and which are denoted by MTJ9, MTJ10, MTJ11 and MTJ8, respectively.

The second output stage includes two STT-MTJs, which are a thirteenth STT-MTJ and a fourteenth STT-MTJ, and which are denoted by MTJ13 and MTJ14, respectively.

The third output stage includes a fifteenth STT-MTJ denoted by MTJ15.

There are sixteen switches, which area first switch to a sixteenth switch, and which are denoted by S1 to S16, respectively.

Hereinafter illustrated are connections in the in-memory computing circuit.

The STT-MTJs in the first output stage are in one-to-one correspondence to STT-MTJ groups, each of which includes two STT-MTJs of the STT-MTJs in the input stage, and the STT-MTJs in the input stage and the STT-MTJs in the first output stage form four DISO in-memory computing units.

The MTJ1, the MTJ4, and the MTJ9 form a first in-memory computing unit. A free layer side of the MTJ1 and a free layer side of the MTJ4 serve as the voltage input terminal and are connected to a first operating voltage Vdd1, a reference layer side of the MTJ1 and a reference layer side of the MTJ4 are connected to a reference layer side of the MTJ9 via the first switch S1, a free layer side of the MTJ9 is connected to a ground via the ninth switch S9.

The MTJ2, the MTJ3, and the MTJ10 form a second in-memory computing unit. A free layer side of the MTJ2 and a free layer side of the MTJ3 serve as the voltage input terminal and are connected to the first operating voltage Vdd1, a reference layer side of the MTJ2 and a reference layer side of the MTJ3 are connected to a reference layer side of the MTJ10 via the fourth switch S4, a free layer side of the MTJ10 is connected to the ground via the twelfth switch S12.

The MTJ5, the MTJ8, and the MTJ11 form a third in-memory computing unit. A free layer side of the MTJ5 and a free layer side of the MTJ8 serve as the voltage input terminal and are connected to the first operating voltage Vdd1, a reference layer side of the MTJ5 and a reference layer side of the MTJ8 are connected to a reference layer side of the MTJ11 via the fifth switch S5, a free layer side of the MTJ11 is connected to the ground via the thirteenth switch S13.

The MTJ6, the MTJ7, and the MTJ12 form a fourth in-memory computing unit. A free layer side of the MTJ6 and a free layer side of the MTJ7 serve as the voltage input terminal and are connected to the first operating voltage Vdd1, a reference layer side of the MTJ6 and a reference layer side of the MTJ7 are connected to a reference layer side of the MTJ12 via the eighth switch S8, a free layer side of the MTJ12 is connected to the ground via the sixteenth switch S16.

The STT-MTJs in the second output stage are in one-to-one correspondence to STT-MTJ groups, each of which includes two STT-MTJs of the STT-MTJs in the first output stage, and the STT-MTJs in the first output stage and the STT-MTJs in the second output stage form two DISO in-memory computing units.

The MTJ9, the MTJ10, and the MTJ13 form a fifth in-memory computing unit. A reference layer side of the MTJ9 and a reference layer side of the MTJ10 serve as the voltage input terminal, the reference layer side of the MTJ9 is connected to a second operating voltage Vdd2 via the second switch S2, and the reference layer side of the MTJ10 is connected to the second operating voltage Vdd2 via the third switch S3, a free layer side of the MTJ9 is connected to a free layer side of the MTJ13 via the tenth switch S10, and a free layer side of the MTJ10 is connected to the free layer side of the MTJ13 via the eleventh switch S11.

The MTJ11, the MTJ12, and the MTJ14 form a sixth in-memory computing unit. A reference layer side of the MTJ11 and a reference layer side of the MTJ12 serve as the voltage input terminal, the reference layer side of the MTJ11 is connected to a second operating voltage Vdd2 via the sixth switch S6, and the reference layer side of the MTJ12 is connected to the second operating voltage Vdd2 via the seventh switch S7, a free layer side of the MTJ11 is connected to a free layer side of the MTJ14 via the fourteenth switch S14, and a free layer side of the MTJ12 is connected to the free layer side of the MTJ14 via the fifteenth switch S15.

The two STT-MTJs in the second output stage and the single STT-MTJ in the third output stage form a seventh DISO in-memory computing unit.

A free layer side of the MTJ13 and a free layer side of the MTJ14 serve as the voltage input terminal, a reference layer side of the MTJ13 and a reference layer side of the MTJ14 are connected to a reference layer side of the MTJ15, and a free layer side of the MTJ15 is connected to the ground.

The circuit as shown in FIG. 3 may be configured to implement the first-order Robert operator. Hereinafter is a truth table of the first-order Robert operator.

| First Input | Second Input | Third Input | Fourth Input | Output |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 1 |
| 0 | 1 | 0 | 0 | 1 |
| 0 | 1 | 0 | 1 | 1 |
| 0 | 1 | 1 | 0 | 0 |
| 0 | 1 | 1 | 1 | 1 |
| 1 | 0 | 0 | 0 | 1 |
| 1 | 0 | 0 | 1 | 1 |
| 1 | 0 | 1 | 0 | 0 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 0 |

There may be a case that the first STT-MTJ stores data A, the second STT-MTJ stores a negation A' of the data A, the third STT-MTJ stores data D, the fourth STT-MTJ stores a negation D' of the data D, the fifth STT-MTJ stores data C, and the sixth STT-MTJ stores a negation C' of the data C, the seventh STT-MTJ stores data B, and the eighth STT-MTJ stores a negation B' of the data B. Further, the first in-memory computing unit, the second in-memory computing unit, the third in-memory computing unit, and the fourth in-memory computing unit are configured to implement the AND logical operation, and the fifth in-memory computing unit, the sixth in-memory computing unit, and the seventh in-memory computing unit are configured to implement the OR logical operation. In such case, the switches S1, S4, S5, S8, S9, S12, S13, and S16 is first switched on, so that the AND operations are performed between A and D', A' and D, B and C', and C' and D, respectively under the operating voltage of Vdd1. Then, switches S2, S3, S6, S7, S10, S11, S14, and S15 are switched on, so that an output from each previous stage serves as an input into the corresponding subsequent stage, and the OR operations are performed under the operating voltage of Vdd2. Consequently, the overall logical operation is completed as y=A'*D+A*D'+B*C'+B' *C, that is, image edge extraction based on the Robert operator is implemented. Therefore, the computing manner herein does not rely on a CMOS logic circuit, and in-memory computing is achieved.

Each of the first in-memory computing unit to the seventh in-memory computing unit is capable to implement the four logical operations under different configurations. Hence, the circuit can be reconfigured to implement other operators based on the structure as shown in FIG. 3.

Figure 4:
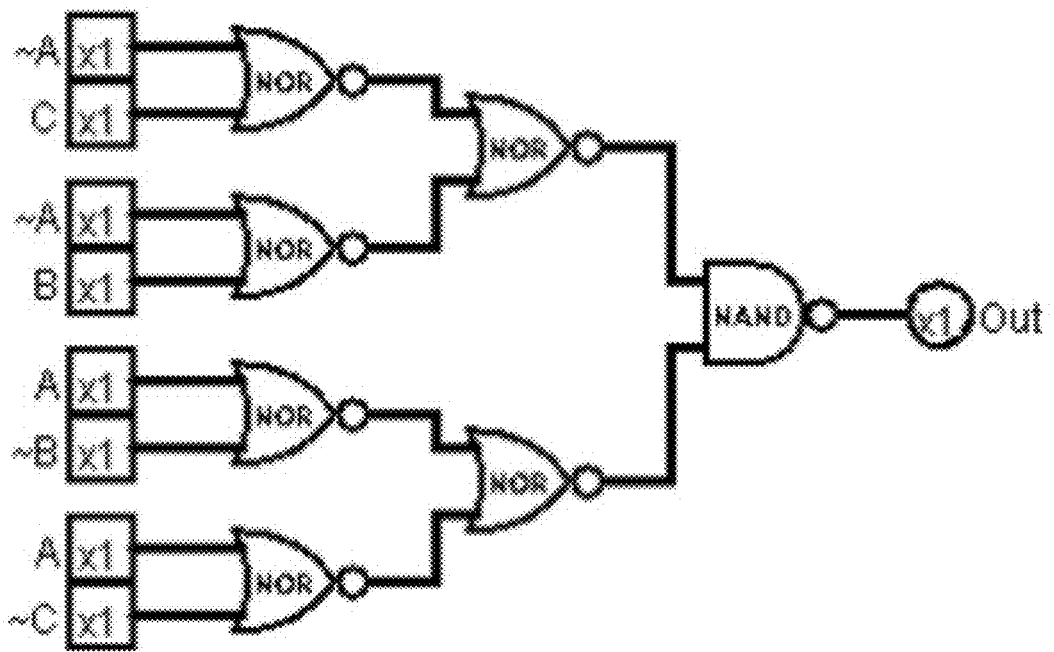
FIG. 4 is a schematic diagram of a logic structure of an in-memory computing circuit having reconfigurable logic which implements a gradient operator according to an embodiment of the present disclosure.

Reference is made to FIG. 4 for an example. The first STT-MTJ stores a negation ~C of data C, the second STT-MTJ storing data A, the third STT-MTJ storing a negation ~B of data B, the fourth STT-MTJ storing the data A, the fifth STT-MTJ storing the data B, the sixth STT-MTJ storing a negation ~A of the data A, the seventh STT-MTJ storing the data C, and the eighth STT-MTJ storing the negation ~A of the data A. The first in-memory computing unit, the second in-memory computing unit, the third in-memory computing unit, the fourth in-memory computing unit, the fifth in-memory computing unit, and the sixth in-memory computing unit are configured to implement the NOR logical operation, and the seventh in-memory computing unit is configured to implement the NAND logical operation. In such case, the in-memory computing circuit is configured to implement a gradient operator.

Figure 5:
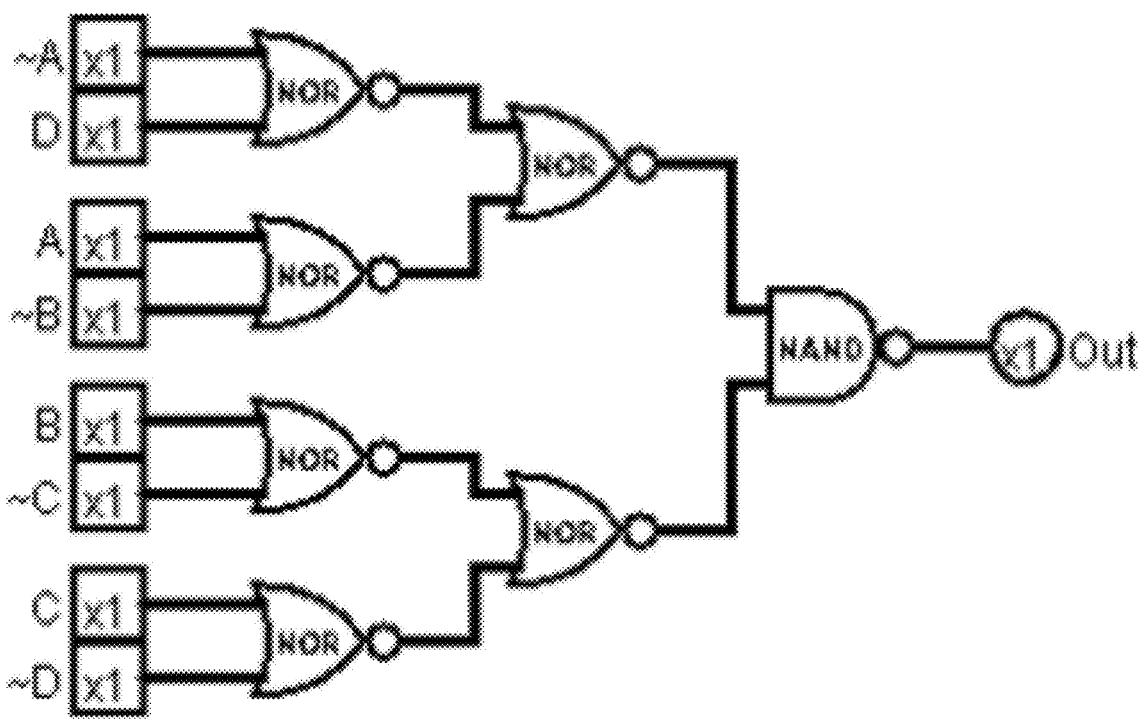
FIG. 5 is a schematic diagram of a logic structure of an in-memory computing circuit having reconfigurable logic which implements a basic operator according to an embodiment of the present disclosure.

Reference is made to FIG. 5 for another example. The first STT-MTJ stores a negation of data D, the second STT-MTJ stores data C, the third STT-MTJ stores a negation ~C of the data C, the fourth STT-MTJ stores data B, the fifth STT-MTJ storing a negation ~B of the data B, the sixth STT-MTJ stores data A, the seventh STT-MTJ stores the data D, and the eighth STT-MTJ stores a negation ~A of the data A. The first in-memory computing unit, the second in-memory computing unit, the third in-memory computing unit, the fourth in-memory computing unit, the fifth in-memory computing unit, and the sixth in-memory computing unit are configured to implement the NOR logical operation, and the seventh in-memory computing unit is configured to implement the NAND logical operation. In such case, the in-memory computing circuit is configured to implement a basic operator.

The structure of the in-memory computing circuit is provided according to embodiments of the present disclosure. Each logical operation unit includes the DISO in-memory computing unit. Input data, logical operations, and results of the operations are all stored in the same circuit architecture, and hence additional accesses to a memory are not necessary. Moreover, the circuit architecture stores the original input data, the computing operation of image edge extraction, and the output result data, which achieves in-memory computing.

Furthermore, the correlation between different logic is implemented through multiple switches which are configured between on-off combinations using time multiplexing. Thereby, an operational amplifier required by conventional spin logic cascading is saved, which reduces power consumption. Moreover, the logic of the last operation has been reconfigured when the current operation is performed, so that confidentiality of the circuit is enhanced.

In addition, the three operators can be achieved under the same circuit architecture through different configurations. A time of reconfiguration is equal to a writing time of the output MTJ for each operation unit, and thus the reconfiguration can be reduced to a nanosecond level. The switches may be controlled by an asynchronous clock to implement the computation process, and hence a CMOS logic circuit is not necessary. Moreover, the circuit supports large-scale parallel computation due to the in-memory computing characteristic.

The in-memory computing circuit provided herein is applicable to a circuit for image edge extraction, and is capable to implement various operators for image edge extraction flexibly.

Hereinabove described are only specific embodiments of the present disclosure, and the protection scope of the present disclosure is not limited thereto. Any person skilled in the art who is familiar with the technical field disclosed in the present disclosure can easily make modification or substitutions, and such modification or substitutions shall all fall within the protection scope of the present disclosure. Therefore, the protection scope of the present disclosure should be defined the scope of the claims.

The invention claimed is:

1. A double-input single-output (DISO) in-memory computing unit, comprising a first input spin transfer torque magnetic tunnel junction (STT-MTJ), a second input STT-MTJ, and one output STT-MTJ, wherein:
   a first terminal of the first input STT-MTJ and a first terminal of the second input STT-MTJ are electrically connected and are configured to receive a first voltage;
   a first terminal of the output STT-MTJ is configured to receive a second voltage;
   a second terminal of the first input STT-MTJ and a second terminal of the second input STT-MTJ are electrically connected to a second terminal of the output STT-MTJ; and
   a difference of first voltage with respect to the second voltage is an operating voltage of the DISO in-memory computing unit.

2. The DISO in-memory computing unit according to claim 1, wherein:
   each of the first input STT-MTJ, the second input STT-MTJ, and the output STT-MTJ comprises a free layer and a reference layer; and
     the first terminal and the second terminal correspond to the free layer and the reference layer, respectively, for each of the first input STT-MTJ, the second input STT-MTJ, and the output STT-MTJ; or
     the first terminal and the second terminal correspond to the reference layer and the free layer, respectively, for each of the first input STT-MTJ, the second input STT-MTJ, and the output STT-MTJ.

3. The DISO in-memory computing unit according to claim 1, wherein:
   the DISO in-memory computing unit is capable to implement different logic operations based on a change in configurations of the DISO in-memory computing unit;
   each of the different logic operations is one of: NAND, NOR, AND, and OR; and
   the configurations comprises a logic level to which the output STT-MTJ is initialized, the operating voltage, and a ratio among critical dimensions of the first input STT-MTJ, the second input STT-MTJ, and the output STT-MTJ.

4. The DISO in-memory computing unit according to claim 3, wherein the DISO in-memory computing unit is configured to implement:
   the NAND logical operation, in response to the logic level being a first level, the operating voltage being in a first range, and the ratio being the first ratio;
   the NOR logical operation, in response to the logic level being the first level, the operating voltage being in a second range, and the ratio being the first ratio;
   the AND logical operation, in response to the logic level being the second level, the operating voltage being in a third range, and the ratio being a second ratio; and
   the NOR logical operation, in response to the logic level being the second level, the operating voltage being in a fourth range, and the ratio being a third ratio.

5. The DISO in-memory computing unit according to claim 3, wherein:
the first level is logic 0, and the second level is logic 1;
the first range is 0.0731V to 0.0908V, the second range is 0.0650V to 0.0730V, the third range is −0.202V to 0.195V, and the fourth range is −0.211V to 0.205V; and
the first ratio is 1:1:1, the second ratio is 1:1:0.5, and the third ratio is 1:1:0.7.

6. An in-memory computing circuit having reconfigurable logic, comprising a plurality of DISO in-memory computing units, each of which is the DISO in-memory computing unit according to claim 1, wherein the plurality of DISO in-memory computing units comprises:
(N+1) stages that are cascaded, wherein N is a positive integer, and for each i which is a positive integer smaller or equal to N:
a quantity of STT-MTJs in the (i+1)-th stage is equal to a half of STT-MTJs in the i-th stage;
the STT-MTJs in the (i+1)-th stage and STT-MTJ pairs in the i-th stage are in a one-to-one correspondence, and each of the STT-MTJ pairs comprises two STT-MTJs in the i-th stage; and
each STT-MTJ in the (i+1)-th stage and the corresponding two STT-MTJs in the i-th stage are comprised in one of the DISO in-memory computing units, wherein said STT-MTJ in the (i+1)-th stage serves as the output STT-MTJ, and the two STT-MTJs in the i-th stage serve as the first input STT-MTJ and the second input STT-MTJ.

7. The in-memory computing circuit according to claim 6, further comprising a plurality of switches, configured to:
connect adjacent stages in the (N+1) stages; and
connect one or more stages in the (N+1) stages to a source supplying the operating voltage.

8. The in-memory computing circuit according to claim 6, wherein:
each of the first input STT-MTJ, the second input STT-MTJ, and the output STT-MTJ comprises a free layer and a reference layer; and
the first terminal and the second terminal correspond to the free layer and the reference layer, respectively, for each of the first input STT-MTJ, the second input STT-MTJ, and the output STT-MTJ; or
the first terminal and the second terminal correspond to the reference layer and the free layer, respectively, for each of the first input STT-MTJ, the second input STT-MTJ, and the output STT-MTJ.

9. The in-memory computing circuit according to claim 8, wherein:
each DISO in-memory computing unit in the in-memory computing circuit is capable to implement different logic operations based on a change in configurations of the DISO in-memory computing unit;
each of the different logic operations is one of: NAND, NOR, AND, and OR; and
the configurations comprises a logic level to which the output STT-MTJ is initialized, the operating voltage, and a ratio among critical dimensions of the first input STT-MTJ, the second input STT-MTJ, and the output STT-MTJ.

10. The in-memory computing circuit according to claim 9, wherein each DISO in-memory computing unit in the in-memory computing circuit is configured to implement:
the NAND logical operation, in response to the logic level being a first level, the operating voltage being in a first range, and the ratio being the first ratio;
the NOR logical operation, in response to the logic level being the first level, the operating voltage being in a second range, and the ratio being the first ratio;
the AND logical operation, in response to the logic level being the second level, the operating voltage being in a third range, and the ratio being a second ratio; and
the NOR logical operation, in response to the logic level being the second level, the operating voltage being in a fourth range, and the ratio being a third ratio.

11. The in-memory computing circuit according to claim 10, wherein:
the first level is logic 0, and the second level is logic 1;
the first range is 0.0731V to 0.0908V, the second range is 0.0650V to 0.0730V, the third range is −0.202V to 0.195V, and the fourth range is −0.211V to 0.205V; and
the first ratio is 1:1:1, the second ratio is 1:1:0.5, and the third ratio is 1:1:0.7.

12. The in-memory computing circuit according to claim 9, wherein each DISO in-memory computing unit in the in-memory computing circuit is capable to implement each of NAND, NOR, AND, and OR logic operations.

13. The in-memory computing circuit according to claim 7, wherein each of the plurality of switches is a single-pole single-throw electronic switch or a single-pole double-throw electronic switch.

14. The in-memory computing circuit according to claim 7, wherein:
N is equal to 3, and the (N+1) stages comprises a first stage, a second stage, a third stage, and a fourth stage that are cascaded in the above-listed sequence;
the plurality of in-memory computing units comprises a first in-memory computing unit, a second in-memory computing unit, a third in-memory computing unit, a fourth in-memory computing unit, a fifth in-memory computing unit, a sixth in-memory computing unit, and a seventh in-memory computing unit;
the first stage and the second stage comprise the first in-memory computing unit, the second in-memory computing unit, the third in-memory computing unit, and fourth in-memory computing unit, for each of which the positive input terminal is configured to receive a voltage equal to a first operating voltage, and the negative input terminal is configured to connect either a ground or an input of the third stage via a first part of the plurality of switches;
the second stage and the third stage comprise the fifth in-memory computing unit and the sixth in-memory computing unit, for each of which the positive input terminal is configured to connect either a voltage equal to a second operating voltage or an output of the first stage via a second part of the plurality of switches, and the negative input terminal is configured to connect an input of the fourth stage; and
the third stage and the fourth stage comprise the seventh in-memory computing unit, the positive input terminal is configured to receive outputs of the second stage, and the negative input terminal is configured to connect the ground.

15. The in-memory computing circuit according to claim 14, wherein:
the first stage comprises eight STT-MTJs which are a first STT-MTJ, a second STT-MTJ, a third STT-MTJ, a fourth STT-MTJ, a fifth STT-MTJ, a sixth STT-MTJ, a seventh STT-MTJ, and an eighth STT-MTJ;

the second stage comprises a tenth STT-MTJ, an eleventh STT-MTJ, and a twelfth STT-MTJ, the third stage comprises a thirteenth STT-MTJ and a fourteenth STT-MTJ;

the fourth stage comprises a fifteenth STT-MTJ;

the plurality of switches comprises a first switch, a second switch, a third switch, a fourth switch, a fifth switch, a sixth switch, a seventh switch, an eighth switch, a ninth switch, a tenth switch, an eleventh switch, a twelfth switch, a thirteenth switch, a fourteenth switch, a fifteenth switch, and a sixteenth switch;

the first STT-MTJ, the fourth STT-MTJ, and the ninth STT-MTJ serve as the first input STT-MTJ, the second input STT-MTJ, and the output STT-MTJ, respectively, of the first in-memory computing unit, the first STT-MTJ and the fourth STT-MTJ are connected to the ninth STT-MTJ via the first switch, and the ninth STT-MTJ is connect to the ground via the ninth switch;

the second STT-MTJ, the third STT-MTJ, and the tenth STT-MTJ serve as the first input STT-MTJ, the second input STT-MTJ, and the output STT-MTJ, respectively, of the second in-memory computing unit, the second STT-MTJ and the third STT-MTJ are connected to the tenth STT-MTJ via the fourth switch, and the tenth STT-MTJ is connect to the ground via the twelfth switch;

the fifth STT-MTJ, the eighth STT-MTJ, and the eleventh STT-MTJ serve as the first input STT-MTJ, the second input STT-MTJ, and the output STT-MTJ, respectively, of the third in-memory computing unit, the fifth STT-MTJ and the eighth STT-MTJ are connected to the eleventh STT-MTJ via the fifth switch, and the eleventh STT-MTJ is connect to the ground via the thirteenth switch;

the sixth STT-MTJ, the seventh STT-MTJ, and the twelfth STT-MTJ serve as the first input STT-MTJ, the second input STT-MTJ, and the output STT-MTJ, respectively, of fourth third in-memory computing unit, the sixth STT-MTJ and the seventh STT-MTJ are connected to the twelfth STT-MTJ via the eighth switch, and the twelfth STT-MTJ is connect to the ground via the sixteenth switch;

the ninth STT-MTJ, the tenth STT-MTJ, and the thirteenth STT-MTJ serve as the first input STT-MTJ, the second input STT-MTJ, and the output STT-MTJ, respectively, of the fifth in-memory computing unit, the ninth STT-MTJ is connected to the second operating voltage via the second switch and connected to the thirteenth STT-MTJ via the tenth switch, and the tenth STT-MTJ is connected to the second operating voltage via the third switch and connected to the thirteenth STT-MTJ via the eleventh switch;

the eleventh STT-MTJ, the twelfth STT-MTJ, and the fourteenth STT-MTJ serves as the first input STT-MTJ, the second input STT-MTJ, and the output STT-MTJ, respectively, of the sixth in-memory computing unit, the eleventh STT-MTJ is connected to the second operating voltage via the sixth switch and connected to the fourteenth STT-MTJ via the fourteenth switch, and the twelfth STT-MTJ is connected to the second operating voltage via the seventh switch and connected to the fourteenth STT-MTJ via the fifteenth switch; and the thirteenth STT-MTJ, the fourteenth STT-MTJ, and the fifteenth STT-MTJ serves as the first input STT-MTJ, the second input STT-MTJ, and the output STT-MTJ, respectively, of the seventh in-memory computing unit.

16. The in-memory computing circuit according to claim 15, configured to implement a first-order Robert operator, wherein:

the bit stored in the second STT-MTJ is a negation of the bit stored in the first STT-MTJ, the bit stored in the fourth STT-MTJ is a negation of the bit stored in the third STT-MTJ, the bit stored in the sixth STT-MTJ is a negation of the bit stored in the fifth STT-MTJ, the bit stored in the eighth STT-MTJ is a negation of the bit stored in the seventh STT-MTJ;

the second in-memory computing unit, the third in-memory computing unit, and the fourth in-memory computing unit are configured to implement the AND logical operation; and the fifth in-memory computing unit, the sixth in-memory computing unit, and the seventh in-memory computing unit are configured to implement the OR logical operation.

17. The in-memory computing circuit according to claim 15, configured to implement a gradient operator, wherein:

the bit stored in the first STT-MTJ is a negation of the bit stored in the seventh STT-MTJ, the bit stored in the second STT-MTJ is identical to the bit stored in the fourth STT-MTJ, the bit stored in the third STT-MTJ is a negation of the bit stored in the fifth STT-MTJ, each of the bit stored in the sixth STT-MTJ and the bit stored in the eighth STT-MTJ is a negation of the bit stored in the second STT-MTJ;

the first in-memory computing unit, the second in-memory computing unit, the third in-memory computing unit, the fourth in-memory computing unit, the fifth in-memory computing unit, and the sixth in-memory computing unit are configured to implement the NOR logical operation; and the seventh in-memory computing unit is configured to implement the NAND logical operation.

18. The in-memory computing circuit according to claim 15, configured to implement a basic operator, wherein:

the bit stored in the first STT-MTJ is a negation of the bit stored in the seventh STT-MTJ, the bit stored in the third STT-MTJ is a negation of the bit stored in the second STT-MTJ, the bit stored in the fifth STT-MTJ is a negation of the bit stored in the fourth STT-MTJ, and the bit stored in the eighth STT-MTJ is a negation of the bit stored in the sixth STT-MTJ;

the first in-memory computing unit, the second in-memory computing unit, the third in-memory computing unit, the fourth in-memory computing unit, the fifth in-memory computing unit, and the sixth in-memory computing unit are configured to implement the NOR logical operation; and the seventh in-memory computing unit is configured to implement the NAND logical operation.

\* \* \* \* \*